United States Patent
Yang et al.

(10) Patent No.: US 11,030,426 B2
(45) Date of Patent: Jun. 8, 2021

(54) ELECTRONIC BOOK FOR DETECTING PAGE CODES BY USING WIRELESS RADIO-FREQUENCY TECHNOLOGY

(71) Applicants: Chun-Hsiang Yang, Taoyuan (TW); Hung-Wang Hsu, Taoyuan (TW)

(72) Inventors: Chun-Hsiang Yang, Taoyuan (TW); Hung-Wang Hsu, Taoyuan (TW)

(73) Assignee: ASIANLINK TECHNOLOGY INCORPORATION, Taoyuan (TW)

( * ) Notice: Subject to any disclaimer, the term of this patent is extended or adjusted under 35 U.S.C. 154(b) by 0 days.

(21) Appl. No.: 16/663,250

(22) Filed: Oct. 24, 2019

(65) Prior Publication Data

US 2021/0124883 A1   Apr. 29, 2021

(51) Int. Cl.
  *G06K 7/08*    (2006.01)
  *G06K 7/10*    (2006.01)
  *G06K 19/077*  (2006.01)

(52) U.S. Cl.
  CPC ... *G06K 7/10316* (2013.01); *G06K 19/07777* (2013.01)

(58) Field of Classification Search
  CPC .................................................. G06K 19/077
  See application file for complete search history.

(56) References Cited

U.S. PATENT DOCUMENTS

| | | | | |
|---|---|---|---|---|
| 4,837,556 A * | 6/1989 | Matsushita | ............ | B64G 1/428 340/531 |
| 5,791,648 A * | 8/1998 | Hohl | ....................... | G06K 7/085 273/238 |
| 2002/0079908 A1 * | 6/2002 | Hohl | ................... | G01R 31/2829 324/654 |
| 2008/0242051 A1 * | 10/2008 | Yamazaki | ............. | H01L 27/115 438/458 |
| 2008/0318367 A1 * | 12/2008 | Shimomura | ...... | H01L 21/26506 438/151 |
| 2009/0081845 A1 * | 3/2009 | Yamazaki | ......... | H01L 21/02002 438/406 |
| 2009/0146408 A1 * | 6/2009 | Kim | ........................ | G06F 15/16 283/67 |
| 2013/0278378 A1 * | 10/2013 | Hoegerl | ........... | G06K 19/07372 340/5.8 |
| 2018/0136746 A1 * | 5/2018 | Yokotsuka | ............ | G06F 3/0488 |
| 2018/0150439 A1 * | 5/2018 | Rahman | .............. | G06F 3/04847 |
| 2018/0225230 A1 * | 8/2018 | Litichever | ............. | G06F 13/107 |

* cited by examiner

*Primary Examiner* — Thien M Le
(74) *Attorney, Agent, or Firm* — Che-Yang Chen; Law Office of Michael Chen

(57) ABSTRACT

An electronic book for detecting page codes by using wireless radio-frequency technology comprising a book and a base, the book comprises a plurality of book pages, and each of the book pages is respectively provided with a wireless radio-frequency unit. The base is provided with an antenna coil and a control circuit, the wireless radio-frequency unit of each of the book pages is disposed at a position opposite to an upper side of the antenna coil. A magnetic flux generated by the antenna coil is transmitted to the wireless radio-frequency unit for generating an operating power to provide for a sensor chip. (The sensor chip generates a digital signal which is converted by a central processing unit to generate a page code output command to control and generate a prompt function of the book page correspondingly disposed above a position of the antenna coil.

8 Claims, 8 Drawing Sheets

ELECTRONIC BOOK FOR DETECTING PAGE CODES BY USING WIRELESS RADIO-FREQUENCY TECHNOLOGY

BACKGROUND OF THE INVENTION

Field of Invention

The present invention relates to an electronic book, and more particularly to an electronic book for detecting page codes by using wireless radio-frequency technology which can effectively reduce the manufacturing costs and avoid the danger of using magnet.

Related Art

With the advent of the digital technology era, many electronic and electrical products are also designed to feature the digital image mode. In addition to electronic and electrical products, some audio books such as story books and teaching books also use sound transmitting mode to help readers to improve the understanding of the book contents. Especially for young children and visually impaired people, the development of audio books provides great fun and convenience for young children and visually impaired readers in reading books. Currently there are audio books on the market that mainly use the method of light sensor or magnet sensing for page code detection. The apertures are disposed in the book pages, a plurality of light sensors are arranged under the apertures, and a quantity of the apertures is sequentially increased according to each of the pages. With the apertures and the light sensors, when the book pages are turned, light beam can pass through the different quantities of the apertures of each of the pages to actuate the different quantities of the light sensors, and sound data of the page that is previously set is sent out, so that the reader can hear the sound while reading the book. But the cost of using light sensor is high, and the design of the light-transmitting structure also needs to be quite precise to avoid the problem of light leakage. In addition, regarding other technical means of sensing page codes and sensing contents on the pages, the former means is not very satisfactory, because the electric charge of the page code sensor is close to the noise in the environmental space, the capacitive sensor cannot effectively detect it as noise or the page code sensor. Therefore, in order to improve the defect, a method for increasing the amount of electric charge of the page code sensor is developed. In addition, a magnet is embedded in the book page and the Hall IC sensing method is applied to make sure the page code can be detected every time. However, the cost of Hall IC is high, the more the number of book pages, the higher the number of Hall ICs, resulting in increased manufacturing costs. Moreover, in order to embed the magnet in the book pages, it is required to dispose the magnet between the two pieces of paper, such processing method can only be done by manually positioning the magnet in a proper position, and then the pieces of paper are bonded. In addition to the processing being very time-consuming and labor-intensive, when children are using the book, the magnet can be easily removed and the children may swallow the magnet accidentally. Therefore, the method of applying the magnet is relatively dangerous in usage.

Therefore, how to solve the above problems and drawbacks in the prior art is what the inventor of the present invention and relevant manufacturers engaged in this industry are eager to research and make improvement.

SUMMARY OF THE INVENTION

Therefore, in order to effectively solve the above problems, a main object of the present invention is to provide an electronic book for detecting page codes by using wireless radio-frequency technology, which can effectively reduce the manufacturing costs and avoid the danger of using magnet.

In order to achieve the above object, the present invention provides an electronic book for detecting page codes by using wireless radio-frequency technology, which comprises a book and a base, wherein the book comprises a plurality of book pages, and each of the book pages is respectively provided with a wireless radio-frequency unit. The wireless radio-frequency unit has at least one sensor chip and at least one inductive coil. The base is provided with an antenna coil and a control circuit, and the control circuit has an LC oscillation unit, a receiving unit, a central processing unit, and a prompt signal generating unit. Wherein the book can be carried on the base, and the wireless radio-frequency unit of each of the book pages is disposed at a position opposite to an upper side of the antenna coil. The LC oscillation unit generates a resonance and causes the antenna coil to generate a magnetic flux, the magnetic flux generated by the antenna coil is transmitted to the wireless radio-frequency unit disposed at a position above the antenna coil, and the inductive coil of the wireless radio-frequency unit receives its magnetic flux and generates an operating power from its magnetic flux to provide for the sensor chip. The sensor chip generates a digital signal for the antenna coil, and the digital signal is transmitted to the receiving unit by the antenna coil, the receiving unit receives the digital signal and decodes the digital signal to generate a page code identification signal, and the receiving unit transmits the page code identification signal to the central processing unit. The central processing unit compares the page code identification signal and converts the page code identification signal to generate a page code output command, and via the page code output command the central processing unit controls the prompt signal generating unit to generate a prompt function of the book page correspondingly disposed above a position of the antenna coil. Thereby, the efficacies of reducing the overall manufacturing costs and avoiding the disadvantages of using magnet while having excellent page codes sensing function are achieved.

According to the electronic book for detecting page codes by using wireless radio-frequency technology of the present invention, wherein the central processing unit stores a page code prompt database, the page code prompt database has page code prompt data corresponding to each of the book pages, and when the central processing unit receives the page code identification signal, simultaneously the page code prompt data corresponding to the book page is retrieved according to the page code identification signal. Via the page code output command the central processing unit controls the prompt signal generating unit to generate a page code prompt function of the book page correspondingly disposed above the position of the antenna coil.

According to the electronic book for detecting page codes by using wireless radio-frequency technology of the present invention, wherein the control circuit further has a power supply unit.

According to the electronic book for detecting page codes by using wireless radio-frequency technology of the present invention, wherein the control circuit is further provided with a wireless transmission unit, the wireless transmission unit is electrically connected to the central processing unit, and the wireless transmission unit can be various types of remote control transmitter.

According to the electronic book for detecting page codes by using wireless radio-frequency technology of the present invention, wherein the prompt signal generating unit can be a speaker.

According to the electronic book for detecting page codes by using wireless radio-frequency technology of the present invention, wherein the base is further provided with at least one correction switch, and the correction switch can be one of a photoelectric switch, a magnet switch, a pressure switch, a mechanism switch and a reset switch, a switch that can correct the central processing unit.

According to the electronic book for detecting page codes by using wireless radio-frequency technology of the present invention, wherein a corresponding position at each of the book pages where each of the wireless radio-frequency units being disposed is different, when the book is disposed on the base, a disposing position of the wireless radio-frequency unit of each of the book pages corresponds to a disposing position of the antenna coil of the base, and a disposing area of the antenna coil is larger than an area accumulated by areas of the wireless radio-frequency units.

DETAILED DESCRIPTION OF THE INVENTION

The above objects of the present invention, as well as its structural and functional features, will be described in accordance with the preferred embodiments of the drawings.

Figure 1:
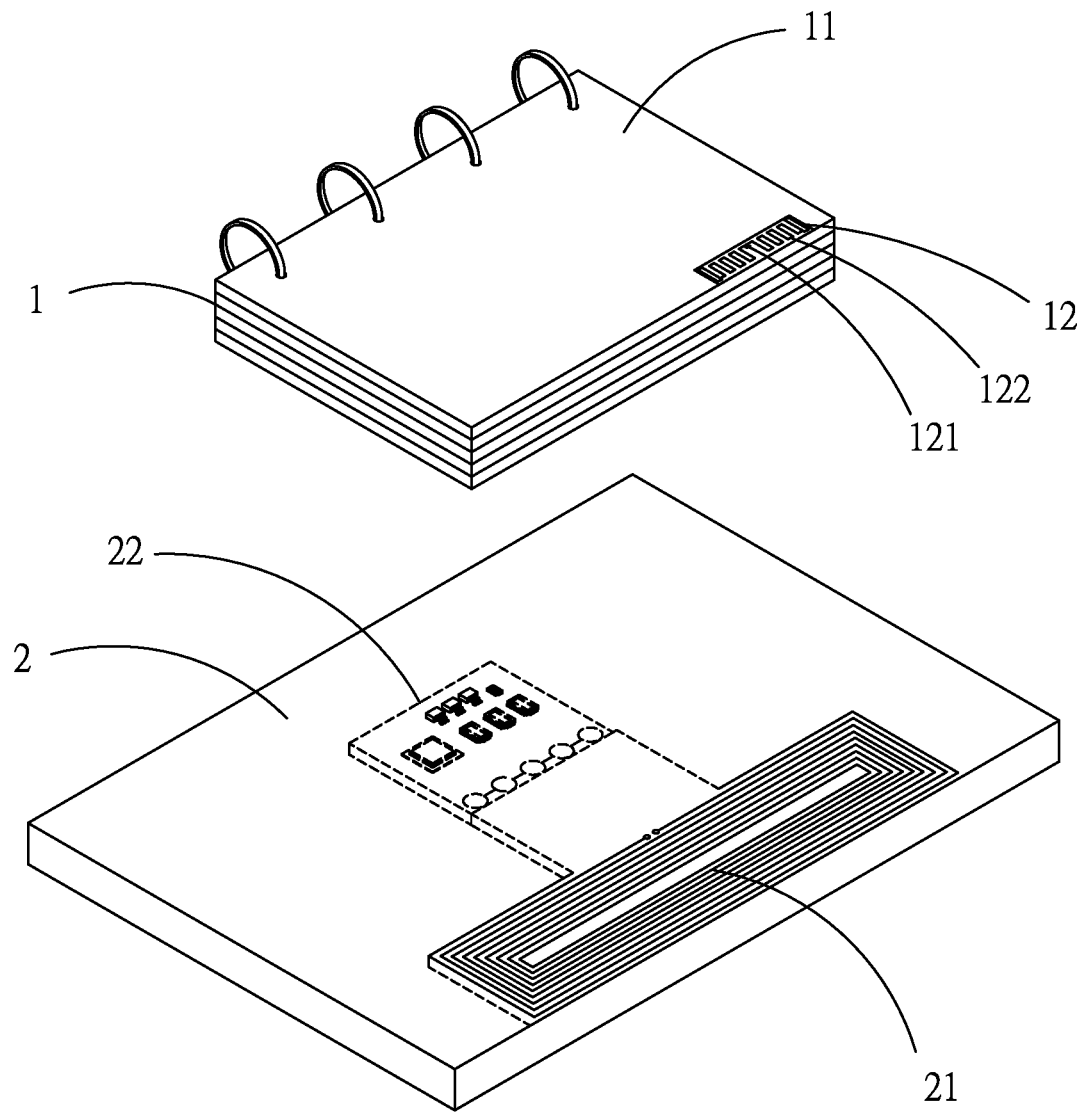
FIG. 1 is a perspective view of an electronic book for detecting page codes by using wireless radio-frequency technology of the present invention.
Figure 2:
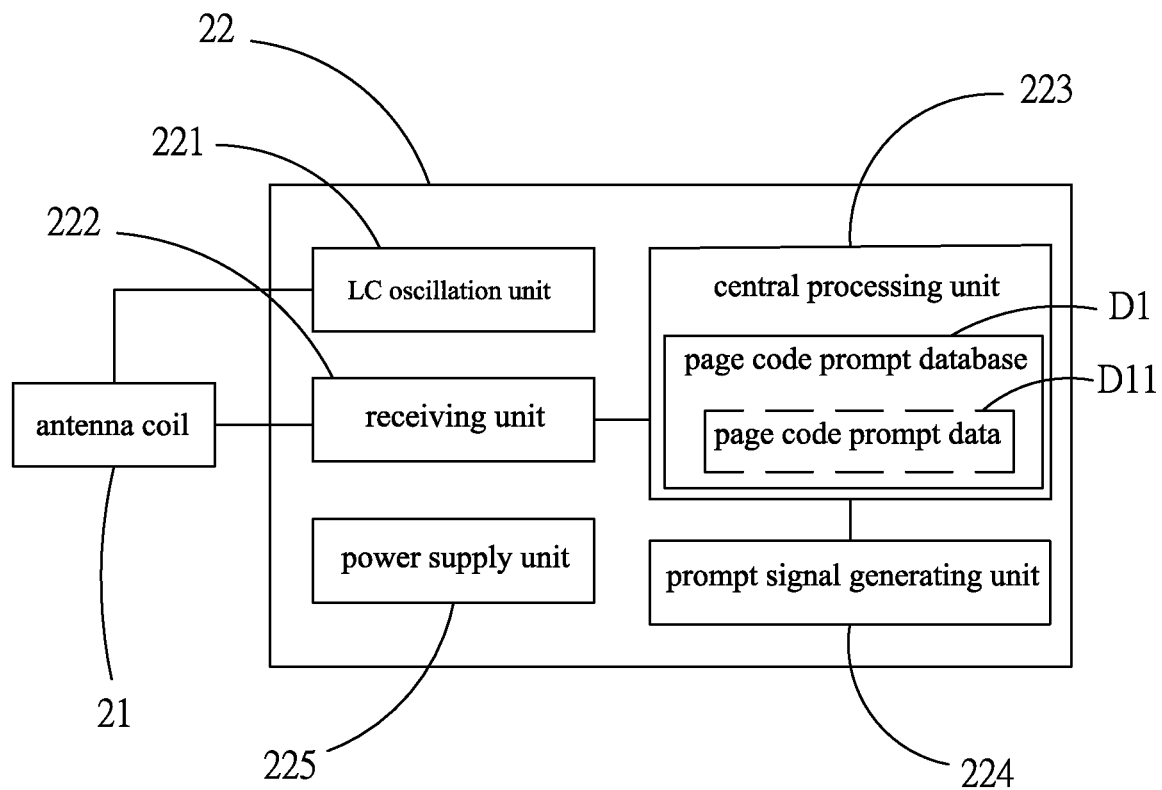
FIG. 2 is a first block diagram of the electronic book for detecting page codes by using wireless radio-frequency technology of the present invention.

Please refer to FIG. 1 and FIG. 2, which are perspective view and first block diagram of an electronic book for detecting page codes by using wireless radio-frequency technology of the present invention. It can be clearly seen from the figures that the present invention comprises a book 1 and a base 2, wherein the book 1 comprises a plurality of book pages 11, but is not limited thereto, can be connected in the form of a plurality of cards or book pages. Each of the book pages 11 has a graphic of the page to which it belongs and is disposed with a wireless radio-frequency unit 12 respectively, and the wireless radio-frequency unit 12 is attached on a surface of the book page 11 or embedded in the book page 11. In this embodiment, corresponding positions of the wireless radio-frequency units 12 being disposed on each of the book pages 11 are different, that is, when the book pages 11 are unturned and attached to each other, the respective wireless radio-frequency units 12 are not stacked on each other. The wireless radio-frequency unit 12 comprises a sensor chip 121 and at least one inductive coil 122 electrically connected with each other, and each of the wireless radio-frequency units 12 stores a code in the sensor chip 121, and the code can be a random code or a sequential code.

The base 2 is provided for placing and carrying the book 1, the base 2 has an antenna coil 21 and a control circuit 22, and the base 2 uses a plastic plate or other insulating materials as the base body. The antenna coil 21 can transmit and receive a magnetic flux, the antenna coil 21 can be disposed on a surface of the base 2 or embedded in the base 2, and the setting mode is mainly to stably transmit and receive the magnetic flux. In the present embodiment, the antenna coil 21 is disposed on the surface of the base 2 and electrically connected to the control circuit 22. The control circuit 22 has an LC oscillation unit 221, a receiving unit 222, a central processing unit 223, a prompt signal generating unit 224 and a power supply unit 225, wherein the LC oscillation unit 221 is electrically connected to the antenna coil 21 and the receiving unit 222, the receiving unit 222 is electrically connected to the central processing unit 223, and the central processing unit 223 is electrically connected to the prompt signal generating unit 224. Wherein the prompt signal generating unit 224 can be an audio generating unit, but is not limited thereto, the prompt signal generating unit 224 can also be a light prompt signal generating unit or a mechanism actuation prompt signal generating unit. When the prompt signal generating unit 224 reacts to light or mechanism actuation to generate a prompt signal, each of the book pages 11 of the book 1 is provided with a corresponding light generating member or a mechanism actuating member. In this embodiment, the prompt signal generating unit 224 is embodied as a speaker, the central processing unit 223 stores a plurality of page code prompt databases D1, the page code prompt database D1 has a plurality of page code prompt data D11, and the power supply unit 225 supplies an operating power for the control circuit 22.

Figure 3:
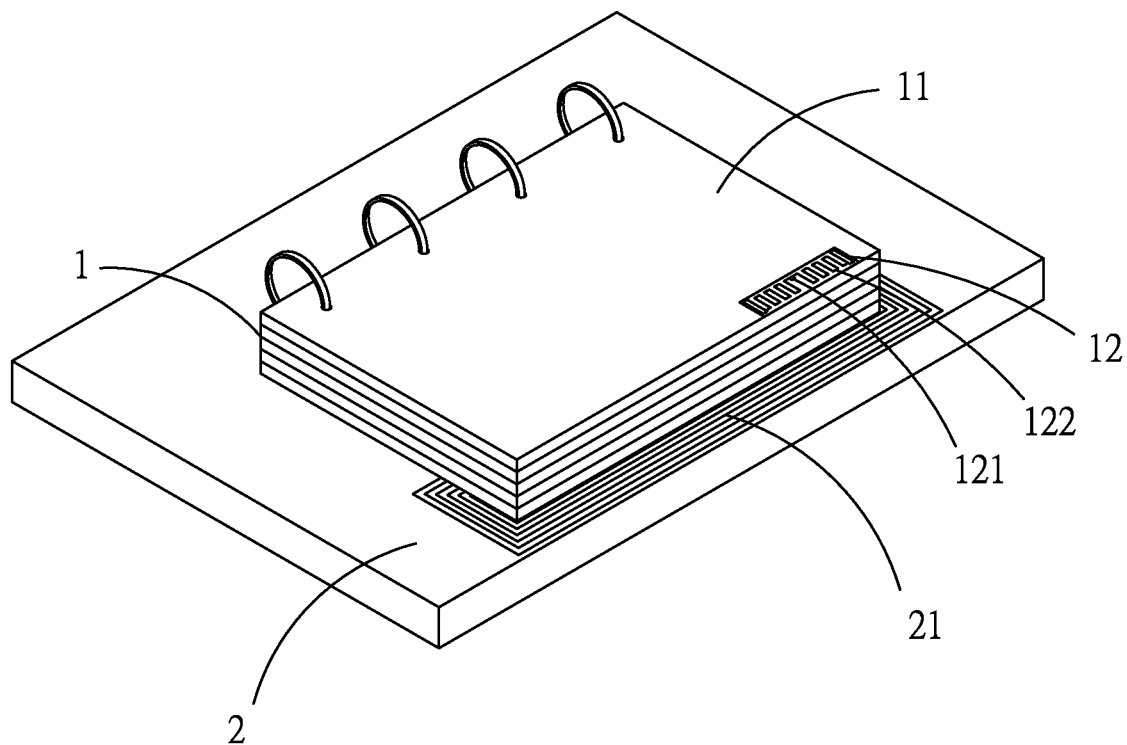
FIG. 3 is a first perspective view of the implementation of the electronic book for detecting page codes by using wireless radio-frequency technology of the present invention.
Figure 4:
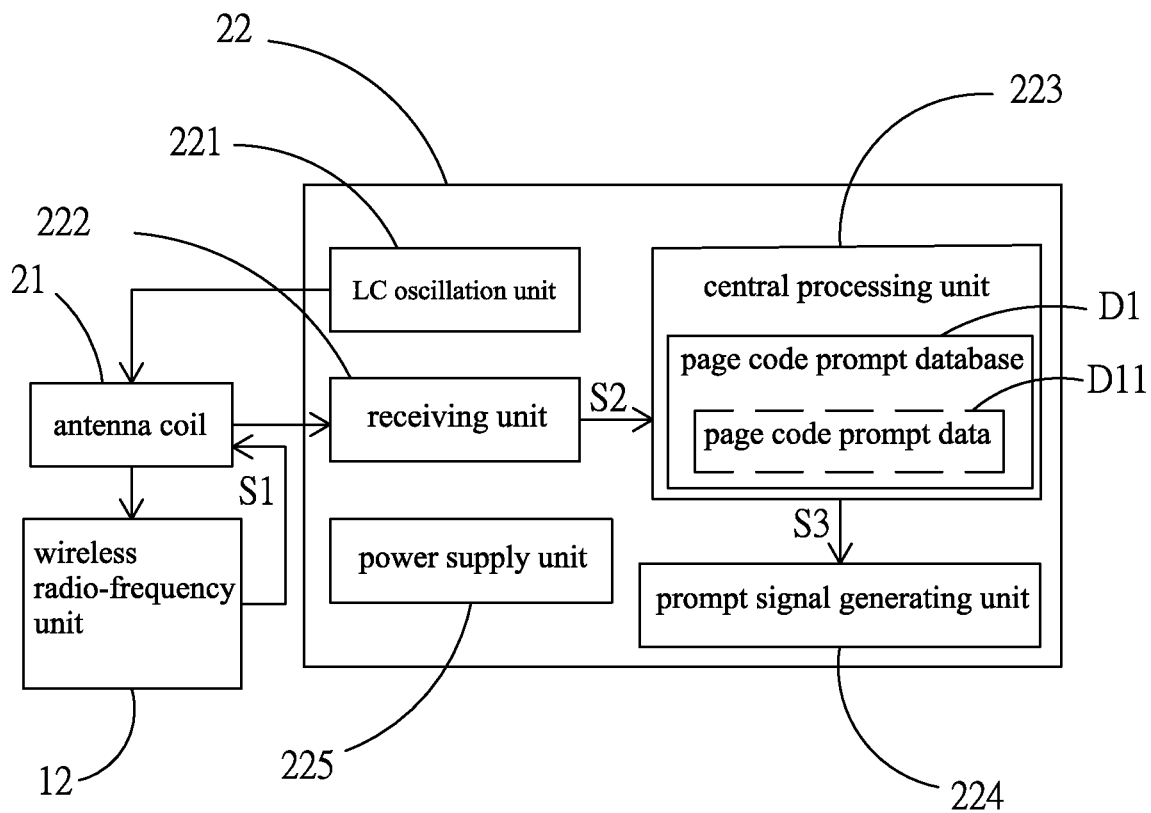
FIG. 4 is a second block diagram of the electronic book for detecting page codes by using wireless radio-frequency technology of the present invention.
Figure 5:
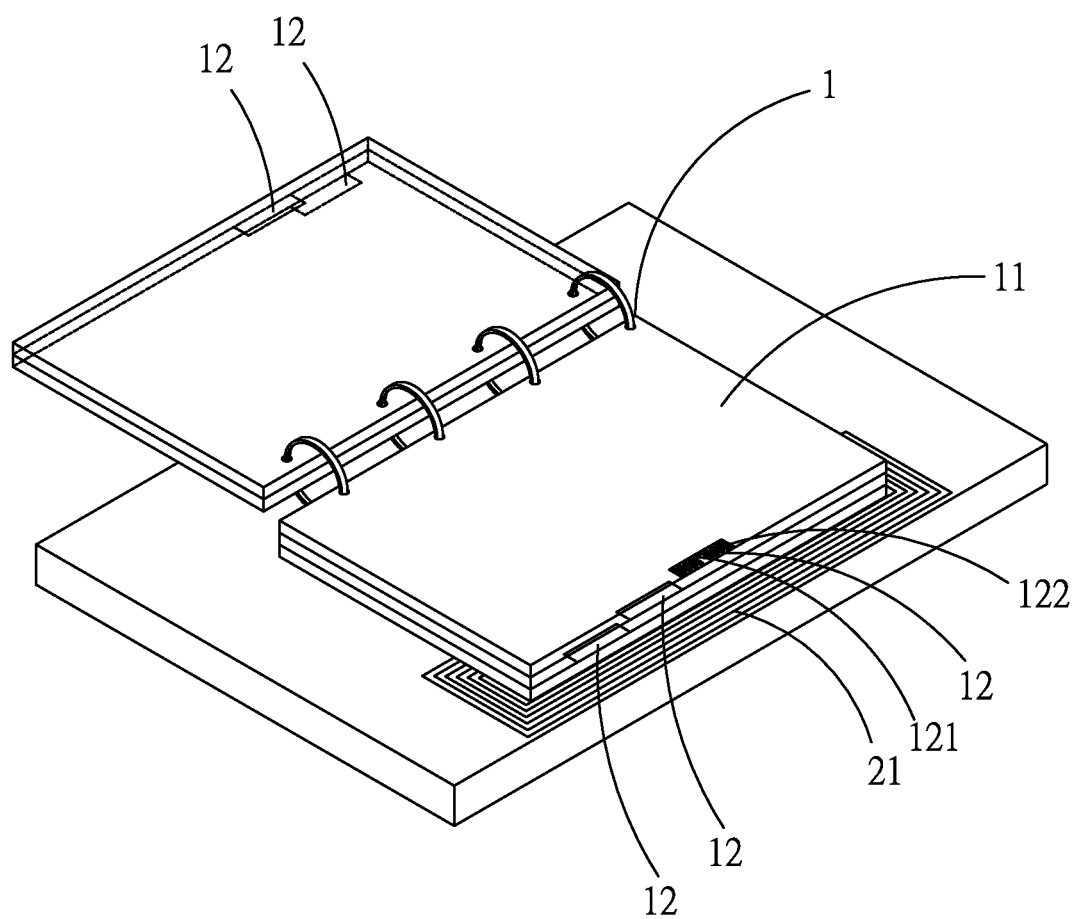
FIG. 5 is a second perspective view of the implementation of the electronic book for detecting page codes by using wireless radio-frequency technology of the present invention.

Please refer to the foregoing drawings and FIGS. 3, 4 and 5, which are first perspective view of the implementation of the electronic book for detecting page codes by using wireless radio-frequency technology of the present invention; second block diagram of the electronic book for detecting page codes by using wireless radio-frequency technology of the present invention; and second perspective view of the implementation of the electronic book for detecting page codes by using wireless radio-frequency technology of the present invention. Wherein the book 1 is disposed on the base 2 and is supplied with power by the power supply unit 225, the LC oscillation unit 221 generates a resonance and the resonance phenomenon causes the antenna coil 21 to generate the magnetic flux. The magnetic flux generated by the antenna coil 21 is transmitted to the wireless radio-frequency unit 12 of the book 1, and the wireless radio-frequency unit 12 receives the magnetic flux via the inductive coil 122. At the same time, the wireless radio-frequency unit 12 generates an operating power, and the operating power enables the sensor chip 121 to generate a digital signal S1, the digital signal S1 is then transmitted to the antenna coil 21, and the antenna coil 21 transmits the digital signal S1 to the receiving unit 222. After the receiving unit 222 receives the digital signal S1, coding of the digital signal S1 is decoded and converted into a page code identification signal S2, and the receiving unit 222 transmits the page code identification signal S2 to the central processing unit 223. The central processing unit 223 receives the page code identification signal S2, the page code identification signal S2 is compared and converted to generate a page code output command S3, and via the page code output command S3 the central processing unit 223 controls the prompt signal generating unit 224 to generate a prompt function of the book page 11 correspondingly disposed above a position of the antenna coil 21. The page code prompt database D1 has the page code prompt data D11 corresponding to each of the book pages 11, and when the central processing unit 223 receives the page code identification signal S2, simultaneously the page code prompt data D11 corresponding to the book page 11 is retrieved according to the page code identification signal S2. Via the page code output command S3 the central processing unit 223 controls the prompt signal generating unit 224 to generate the page code prompt data D11 of the book page 11 correspondingly disposed above a position of the antenna coil 21.

In addition, the code of the wireless radio-frequency unit 12 can be a random code or a sequential code, but is not limited thereto. In this embodiment, the book pages 11 are implemented by 5 pages, the random codes for first to fifth pages are sequentially exemplified by 6379, 8452, 1423, 7128, and 4135 respectively, and the sequential codes can be exemplified by 0001, 0002, 0003, 0004, and 0005. The book 1 and the base 2 are interactively implemented as follows.

For example, the random code combination is used, the codes stored in the sensor chip 121 of the wireless radio-frequency unit 12 of each of the book pages 11 are 6379, 8452, 1423, 7128, and 4135 respectively, if the book 1 is disposed on the base 2 and is unturned, it means that when the first page is a facing page, the code of each of the book pages 11 is transmitted as the digital signal S1 to the receiving unit 222 from the sensor chips 121. At this time, the receiving unit 222 receives 5 sets of the codes of 6379, 8452, 1423, 7128, and 4135 respectively, since the code of each of the book pages 11 is unique, the code combination received by the receiving unit 222 is also unique. Thus the unique code combination can generate a unique set of the page code identification signal S2. Using the above as an example, the combination of 6379, 8452, 1423, 7128, 4135 represents that the first page is the facing page, and the receiving unit 222 receives the code combination of the five sets, the code combination is then decoded and converted into the page code identification signal S2. The central processing unit 223 receives the page code identification signal S2 and determines that it is the first book page 11, the central processing unit 223 generates the page code output command S3 corresponding to each of the book pages 11 according to the page code identification signal S2, and then the page code output command S3 is sent to the prompt signal generating unit 224. The prompt signal generating unit 224 generates the page code prompt data D11 corresponding to the book page 11 according to the page code output command S3, that is, the prompt signal generating unit 224 generates the page code prompt data D11 of the first book page 11. At this time, if the second book page 11 is the facing page because the first book page 11 has been turned, and the wireless radio-frequency unit 12 of the first book page 11 has left a sensing range of the antenna coil 21, then the receiving unit 222 only receives the code combination of the four sets of codes of 8452, 1423, 7128, and 4135. Since this combination is also a unique combination, the central processing unit 223 can determine that this combination with the second book page 11 as the facing page, and subsequently, the same as mentioned above. Advantages of using the code combination are that a plurality of different books 1 can be correspondingly disposed on the base 2, and the codes stored in the sensor chips 121 of the wireless radio-frequency units 12 on the book 1 are different, so that the central processing unit 223 receives the page code identification signal S2 with different combinations, and the central processing unit 223 can generate the different page code output commands S3 from each of the combinations. For example, an animal book for children with pages 1-5 being coded as 6379, 8452, 1423, 7128, 4135, and a car book for children with pages 1-5 being coded as 0001, 0002, 0003, 0004, 0005 are provided, thus sharing the same base 2 is made feasible by determining the code combinations, and it is not necessary to replace the base 2 because the book 1 has to be replaced.

In addition, using a quantity of the codes as an example, the codes stored in the sensor chip 121 of the wireless radio-frequency unit 12 of each of the book pages 11 are 6379, 8452, 1423, 7128, and 4135 respectively, if the book 1 is disposed on the base 2 and is unturned, it means that when the first page is the facing page, the code of each of the book pages 11 is transmitted as the digital signal S1 to the receiving unit 222 from the sensor chips 121. At this time, the receiving unit 222 receives five sets of the codes of 6379, 8452, 1423, 7128, and 4135 respectively, so five sets of the codes represent being the first book page 11, and so on, four sets of the codes represent being the second book page 11, three sets of the codes represent being the third book page 11, etc. Thus the receiving unit 222 can generate the page code identification signal S2 according to a quantity of the codes received, and the central processing unit 223 receives the page code identification signal S2 and determines that the first book page 11 is the facing page. The central processing unit 223 generates the page code output command S3 corresponding to each of the book pages 11 according to the page code identification signal S2, and then the page code output command S3 is sent to the prompt signal generating unit 224. The prompt signal generating unit 224 generates the page code prompt data D11 corresponding to the book page 11 according to the page code output command S3, that is, the prompt signal generating unit 224 generates the page code prompt data D11 of the first book page 11. Thereby, the efficacies of reducing the overall manufacturing costs and avoiding the danger of using magnet while having excellent page codes sensing function are achieved.

Figure 6:
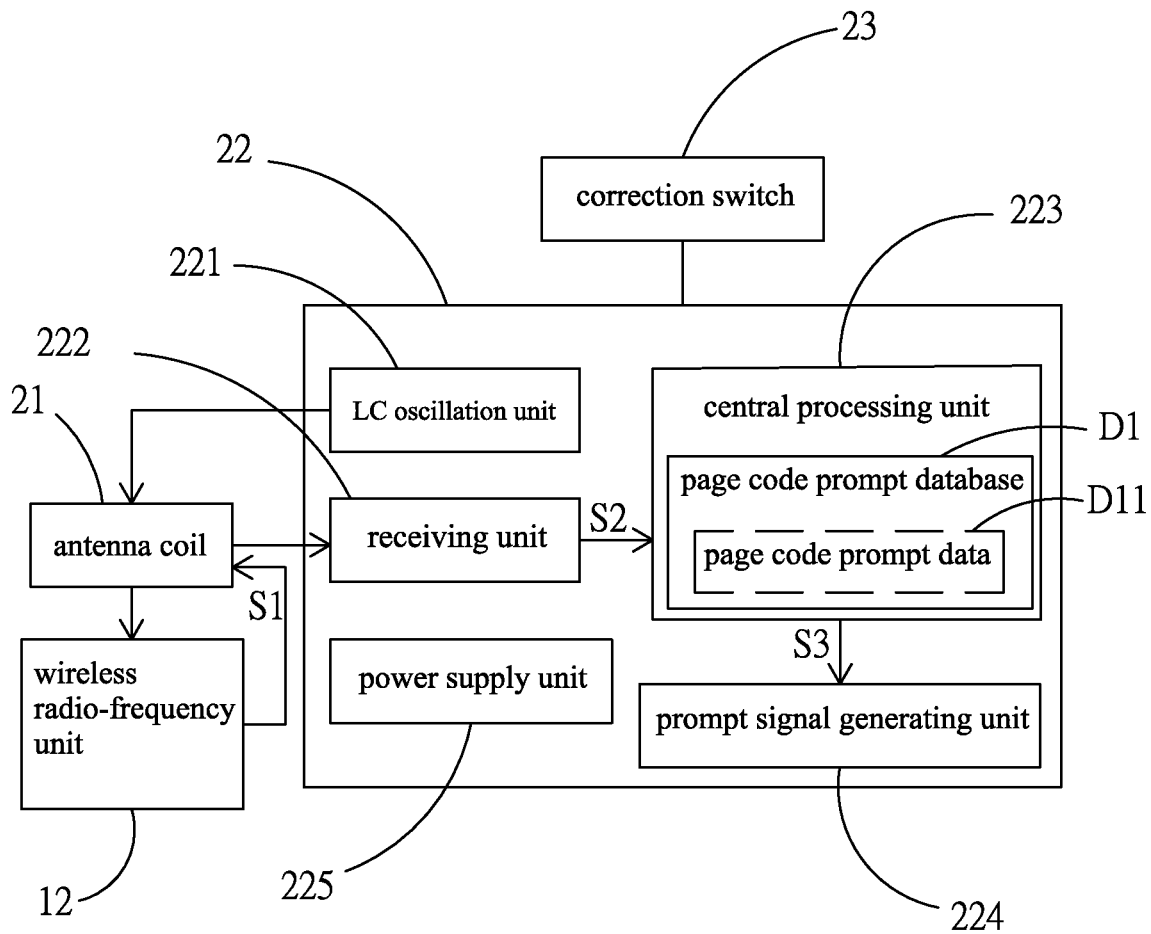
FIG. 6 is a third block diagram of the electronic book for detecting page codes by using wireless radio-frequency technology of the present invention.

Please refer to the foregoing drawings and FIG. 6, which is a third block diagram of the electronic book for detecting page codes by using wireless radio-frequency technology of the present invention, wherein the electronic book for detecting page codes by using wireless radio-frequency technology will be used in different environments. Since there are differences in temperature, pressure or humidity in the different environments, the base 2 is further provided with a correction switch 23, the correction switch 23 can be an automatic correction or a manual correction. Wherein the manual correction can be achieved by a reset switch, and the automatic correction can be achieved by a photoelectric switch, a magnet switch, a pressure switch or a mechanism switch. In this embodiment, the automatic correction is implemented by using a photoelectric switch, that is, the base 2 is disposed with a phototransistor, and a through hole is disposed on the corresponding book page 11 above the phototransistor. The correction switch 23 is activated when the last book page 11 of the book 1 is turned, the central processing unit 223 analyses that a magnetic flux received by the antenna coil 21 is abnormal, because after the last book page 11 is turned, the magnetic flux received by the antenna coil 21 being detected by the central processing unit 223 should be 0. If it is not 0, it represents the magnetic flux is affected by changes in temperature, pressure or humidity, thus the action of magnetic flux correction needs to be performed. After the correction by the correction switch 23, it is advantageous to the efficacy of having excellent sensing function for the subsequent page codes sensing.

Figure 7:
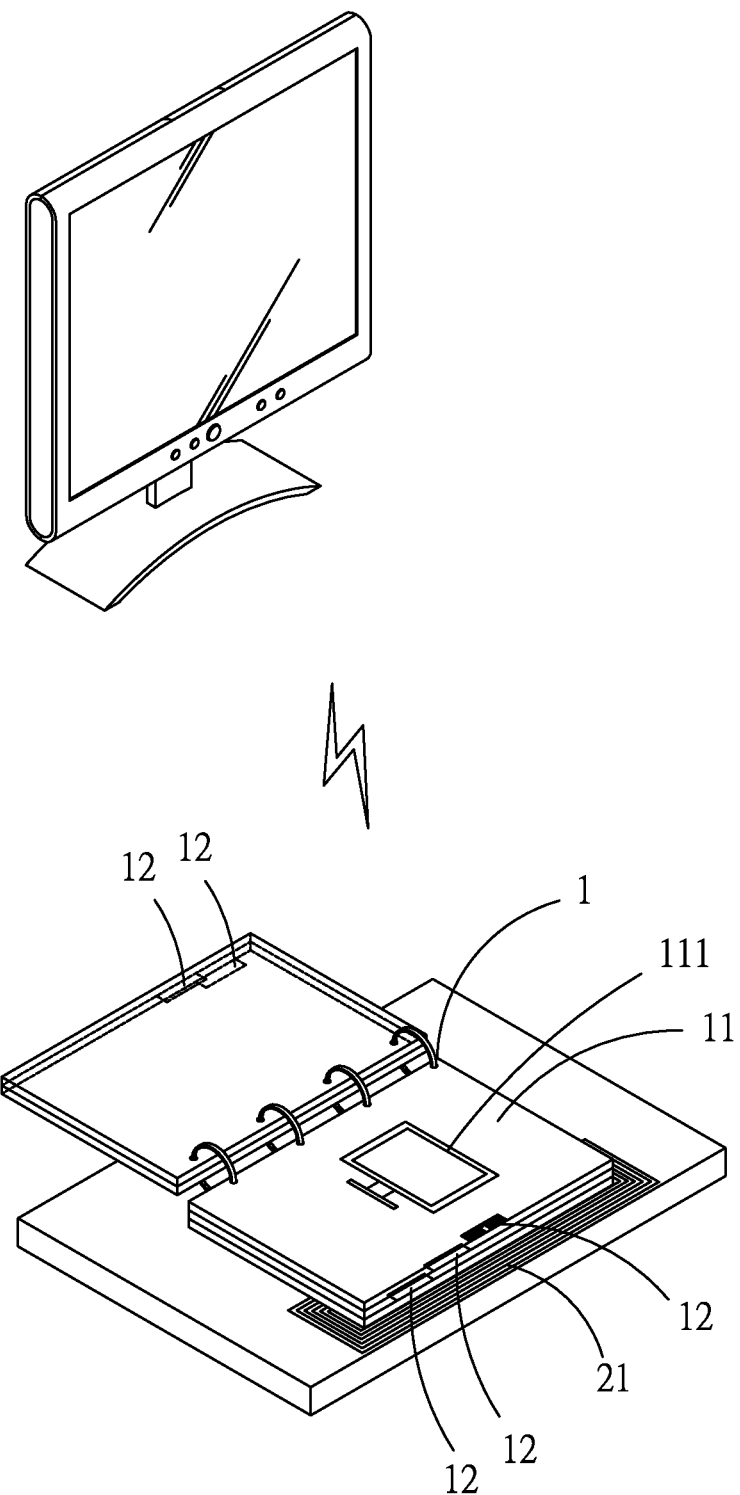
FIG. 7 is a third perspective view of the implementation of the electronic book for detecting page codes by using wireless radio-frequency technology of the present invention.
Figure 8:
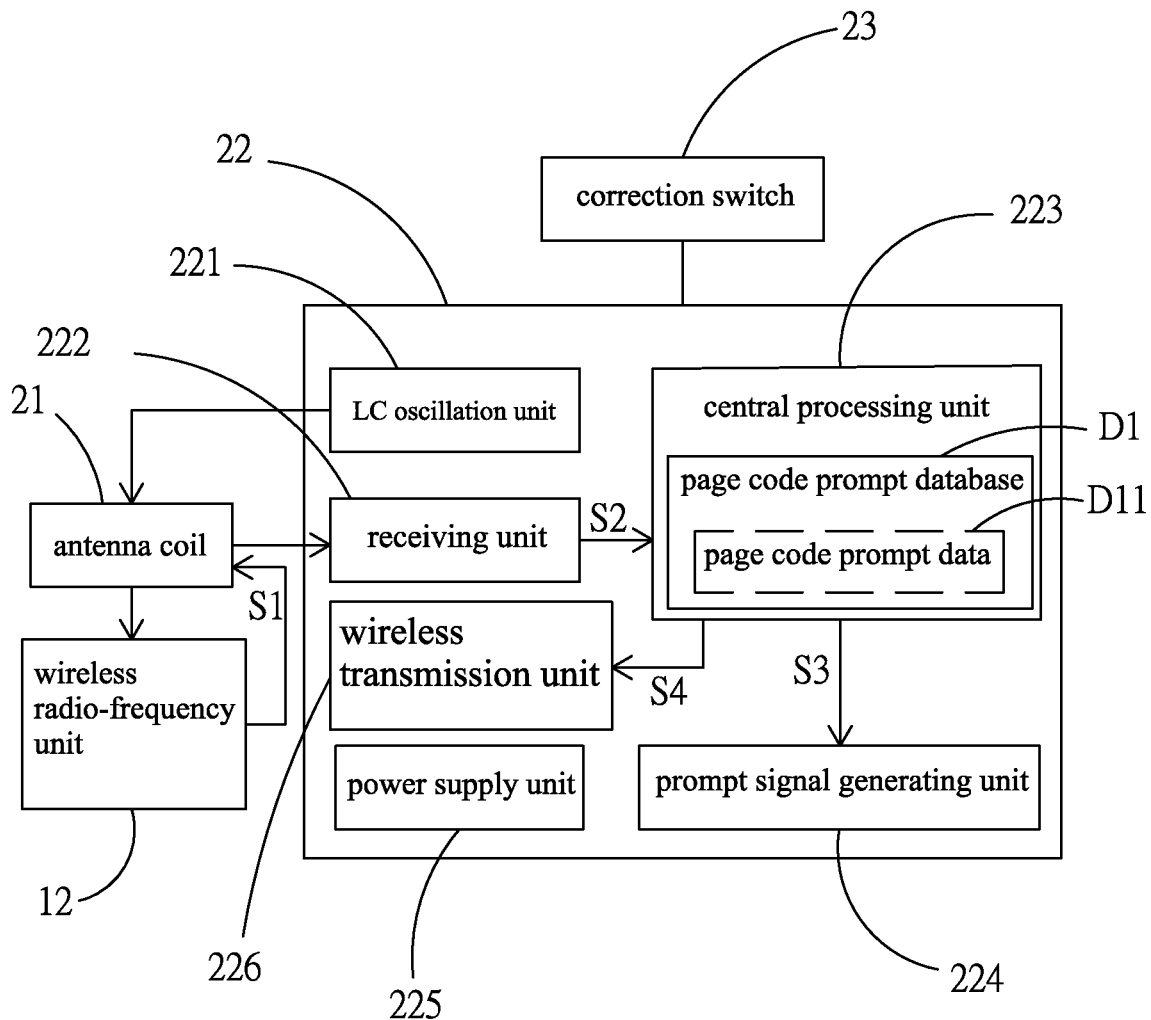
FIG. 8 is a fourth block diagram of the electronic book for detecting page codes by using wireless radio-frequency technology of the present invention.

Please refer to the foregoing drawings and FIG. 7 and FIG. 8, which are third perspective view of the implementation of the electronic book for detecting page codes by using wireless radio-frequency technology of the present invention; and fourth block diagram of the electronic book for detecting page codes by using wireless radio-frequency technology of the present invention. In this embodiment, the control circuit 22 is further provided with a wireless transmission unit 226, and the wireless transmission unit 226 is electrically connected to the central processing unit 223. At least one graphic 111 is disposed on each of the book pages 11 of the book 1, and each of the graphics 111 can be respectively corresponded to different home appliances. When the book 1 is disposed on the base 2 and turned to the graphic 111 of television, for example, the receiving unit 222 receives the digital signal S1, and the digital signal S1 is decoded and converted into the page code identification signal S2. The receiving unit 222 transmits the page code identification signal S2 to the central processing unit 223, the central processing unit 223 generates a control signal S4 which is then sent to the wireless transmission unit 226, and the wireless transmission unit 226 converts the control signal S4 into a corresponding wireless signal. The wireless signal is transmitted to a corresponding home appliance to control the home appliance to generate an action of power on, power off or other actions, thereby an efficacy of controlling actions of the home appliance corresponding to the book page 11 by turning the book 1 can be achieved.

The above description is only preferred embodiments of the present invention, and is not intended to limit the present invention in any way. Although the present invention has been disclosed above by the preferred embodiments, they are not intended to limit the present invention. Any person having ordinary skill in the art can make slight changes or modifications to the above-disclosed technical contents to become equivalent embodiments without departing from the scope of the technical solutions of the present invention. Any simple alterations, equivalent changes and modifications made substantially to the above embodiments in accordance with the techniques of the present invention still fall within the scope covered by the appended claims of the present invention.

What is claimed is:

1. An electronic book for detecting page codes by using wireless radio-frequency technology, comprising:
    a book, the book having a plurality of book pages, each of the book pages being provided with a wireless radio-frequency unit, and the wireless radio-frequency unit having at least one sensor chip and at least one inductive coil; and
    a base, the base having an antenna coil and a control circuit, the control circuit having an LC oscillation unit, a receiving unit, a central processing unit, and a prompt signal generating unit, the LC oscillation unit generating a resonance and causing the antenna coil to generate a magnetic flux, the magnetic flux being transmitted to the wireless radio-frequency unit disposed above a position of the antenna coil, the inductive coil of the wireless radio-frequency unit receiving the magnetic flux and generating an operating power from the magnetic flux to provide for the sensor chip, the sensor chip of each of the book pages generating a digital signal for the antenna coil, the digital signal being transmitted to the receiving unit by the antenna coil, the receiving unit receiving the digital signal and decoding the digital signal to generate a page code identification signal, the receiving unit transmitting the page code identification signal to the central processing unit, the central processing unit comparing the page code identification signal and converting the page code identification signal to generate a page code output command, and a prompt function of the book page correspondingly disposed above the position of the antenna coil being generated by the prompt signal generating unit;
    wherein a corresponding position at each of the book pages where each of the wireless radio-frequency units being disposed is different, when the book is disposed on the base, a disposing position of the wireless radio-frequency unit of each of the book pages corresponds to a disposing position of the antenna coil of the base, and a disposing area of the antenna coil is larger than an area accumulated by areas of the wireless radio-frequency units;
    wherein the digital signals transmitted from the sensor chips of the book pages are combined to generate the page code identification signal.

2. The electronic book for detecting page codes by using wireless radio-frequency technology as claimed in claim 1, wherein the central processing unit stores a page code prompt database, the page code prompt database has page code prompt data corresponding to each of the book pages, when the central processing unit receives the page code identification signal, simultaneously the page code prompt data corresponding to the book page is retrieved according to the page code identification signal, and via the page code output command the central processing unit controls the prompt signal generating unit to generate a prompt function of the book page correspondingly disposed above the position of the antenna coil.

3. The electronic book for detecting page codes by using wireless radio-frequency technology as claimed in claim 1, wherein each of the wireless radio-frequency units stores a code in the sensor chip, the receiving unit receives the digital signal of the code and decodes the digital signal to generate the page code identification signal, the receiving unit transmits the page code identification signal to the central processing unit, and the central processing unit generates the corresponding page code output command according to a combination of the codes.

4. The electronic book for detecting page codes by using wireless radio-frequency technology as claimed in claim 1, wherein the control circuit further has a power supply unit.

5. The electronic book for detecting page codes by using wireless radio-frequency technology as claimed in claim 1, wherein the control circuit is further provided with a wireless transmission unit, the wireless transmission unit is electrically connected to the central processing unit, and the wireless transmission unit can be various types of remote control transmitter.

6. The electronic book for detecting page codes by using wireless radio-frequency technology as claimed in claim 1, wherein the prompt signal generating unit can be a speaker.

7. The electronic book for detecting page codes by using wireless radio-frequency technology as claimed in claim 1, wherein the base is further provided with at least one correction switch, and the correction switch can be one of a photoelectric switch, a magnet switch, a pressure switch, a mechanism switch and a reset switch, a switch that can correct the central processing unit.

8. The electronic book for detecting page codes by using wireless radio-frequency technology as claimed in claim 1, wherein the digital signal from each of the book pages has a random code, and the page code identification signal has sequential codes combined by the random codes.

\* \* \* \* \*